US012796220B2

(12) United States Patent
Lee et al.

(10) Patent No.: US 12,796,220 B2
(45) Date of Patent: Nov. 10, 2026

(54) DISPLAY DEVICE

(71) Applicant: Samsung Display Co., LTD., Yongin-si (KR)

(72) Inventors: Sola Lee, Yongin-si (KR); Kiyoung Kim, Yongin-si (KR); Jongseok Kim, Yongin-si (KR); Donghyun Son, Yongin-si (KR); Jingoo Jung, Yongin-si (KR); Kyung Hyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 499 days.

(21) Appl. No.: 18/216,011

(22) Filed: Jun. 29, 2023

(65) Prior Publication Data

US 2024/0074232 A1 Feb. 29, 2024

(30) Foreign Application Priority Data

Aug. 26, 2022 (KR) ........................ 10-2022-0107670

(51) Int. Cl.
*H10K 59/121* (2023.01)
*H10K 59/122* (2023.01)
(Continued)

(52) U.S. Cl.
CPC ........... *H10K 59/121* (2023.02); *H10K 59/65* (2023.02)

(58) Field of Classification Search
CPC .... H10K 59/121; H10K 59/65; H10K 59/126; H10K 59/352; H10K 59/353;
(Continued)

(56) References Cited

U.S. PATENT DOCUMENTS

2017/0092894 A1* 3/2017 Yang .................... H10K 59/121
2018/0366052 A1* 12/2018 Shi ....................... G09G 3/3275
(Continued)

FOREIGN PATENT DOCUMENTS

CN 113327934 A 8/2021
CN 116709816 A * 9/2023 ........... H10K 50/865
(Continued)

OTHER PUBLICATIONS

English Machine Translation of Yao et al, CN 11670 9816 (Year: 2026).*
(Continued)

*Primary Examiner* — Joseph L Williams
(74) *Attorney, Agent, or Firm* — CANTOR COLBURN LLP

(57) ABSTRACT

A display device includes: a substrate including a first display area including a plurality of first pixel areas and a plurality of transmission areas, and a second display area including a plurality of second pixel areas; a light blocking layer disposed in the first and second display areas on the substrate, wherein an opening overlapping each of the transmission areas is defined through the light blocking layer, and the opening has a planar shape including at least two adjacent curves having different radii of curvature from each other; and a plurality of pixels respectively disposed in the first and second pixel areas on the light blocking layer and each including a light emitting element.

20 Claims, 12 Drawing Sheets

(51) Int. Cl.
*H10K 59/35* (2023.01)
*H10K 59/65* (2023.01)

(58) Field of Classification Search
CPC .. H10K 59/122; H10K 59/123; H10K 59/131; H10K 59/60; H10K 50/86; H10K 50/844; H10K 59/00; H10K 77/10
See application file for complete search history.

(56) References Cited

U.S. PATENT DOCUMENTS

| | | | | |
|---|---|---|---|---|
| 2020/0410921 | A1 | 12/2020 | Kim et al. | |
| 2021/0335955 | A1 | 10/2021 | Son et al. | |
| 2022/0165804 | A1 | 5/2022 | Lee et al. | |
| 2022/0209068 | A1* | 6/2022 | So | H10K 59/60 |

FOREIGN PATENT DOCUMENTS

| | | | |
|---|---|---|---|
| KR | 20210002171 | A | 1/2021 |
| KR | 1020210060186 | A | 5/2021 |
| KR | 1020210082316 | A | 7/2021 |
| KR | 1020210154305 | A | 12/2021 |
| KR | 1020220051684 | A | 4/2022 |
| KR | 20220070135 | A | 5/2022 |

OTHER PUBLICATIONS

Office Action dated Jun. 8, 2026 for Korean Patent Application No. 10-2022-0107670, 14 pages.

* cited by examiner

DISPLAY DEVICE

This application claims priority to Korean Patent Application No. 10-2022-0107670, filed on Aug. 26, 2022, and all the benefits accruing therefrom under 35 U.S.C. § 119, the content of which in its entirety is herein incorporated by reference.

BACKGROUND

1. Field

Embodiments provide generally to a display device. More particularly, embodiments provide a display device that provides visual information.

2. Description of the Related Art

As information technology develops, the importance of display devices, which are communication media between users and information, is being highlighted. Accordingly, the use of display devices such as a liquid crystal display device, an organic light emitting display device, a plasma display device, and the like is increasing.

In addition, various functional modules usable with the display device are being added to the display device. For example, a user may take a picture or video using a camera module disposed inside the display device.

SUMMARY

In a display device, where a camera module is disposed in a non-display area thereof, the non-display area may be increased to secure a space in which the camera module is disposed. Accordingly, various studies are being conducted to dispose the functional module in the display area of the display device.

Embodiments provide a display device that prevents degradation of performance of a functional module due to light introduced around the functional module.

A display device according to embodiments of the disclosure includes a substrate including a first display area including a plurality of first pixel areas and a plurality of transmission areas and a second display area including a plurality of second pixel areas, a light blocking layer disposed in the first and second display areas on the substrate, where an opening overlapping each of the transmission areas is defined through the light blocking layer, and the opening has a planar shape including at least two adjacent curves having different radii of curvature from each other, and a plurality of pixels respectively disposed in the first and second pixel areas on the light blocking layer and each including a light emitting element.

In an embodiment, the opening may be divided into first, second, third, and fourth areas based on a first imaginary line extending in a first direction passing through a center of the opening and a second imaginary line extending in a second direction crossing the first direction passing through the center in a plan view. In such an embodiment, the first and third areas may be opposite to each other with respect to the center of the opening, and the second and fourth areas may be opposite to each other with respect to the center of the opening.

In an embodiment, the first, second, third, and fourth areas may have planar shapes symmetrical to each other.

In an embodiment, the first, second, third, and fourth areas may have planar shapes asymmetrical to each other.

In an embodiment, the substrate may include a first base layer including a polymer film, a first barrier layer disposed on the first base layer, a second base layer disposed on the first barrier layer and including a polymer film, and a second barrier layer disposed on the second base layer.

In an embodiment, an arrangement of sub-pixels of each of the plurality of pixels disposed in the first pixel areas may be to the same as an arrangement of sub-pixels of each of the plurality of pixels disposed in the second pixel areas.

In an embodiment, each of the plurality of pixels may include a blue sub-pixel arranged in a first column, a red sub-pixel arranged in a first row and a second column adjacent to the first column, and a green sub-pixel arranged in a second row adjacent to the first row and in the second column.

In an embodiment, a size of the blue sub-pixel may be different from a size of the red sub-pixel and a size of the green sub-pixel in a plan view.

In an embodiment, each of the red sub-pixel, the green sub-pixel, and the blue sub-pixel may have a rectangular shape in a plan view.

In an embodiment, a transmittance of the second display area may be lower than a transmittance of the first display area.

In an embodiment, the display device may further include a functional module disposed under the substrate to overlap a portion of the substrate corresponding to the first display area.

In an embodiment, the functional module may include at least one selected from a camera module, a face recognition sensor module, a pupil recognition sensor module, an acceleration sensor module, a proximity sensor module, an infrared sensor module, and an illuminance sensor module.

A display device according to embodiments of the disclosure includes a substrate including a plurality of pixel areas and a plurality of transmission areas, a light blocking layer disposed in the first and second pixel areas on the substrate, where an opening overlapping each of the transmission areas is defined through the light blocking layer and, the opening has a planar shape including at least two adjacent curves having different radii of curvature from each other, and a plurality of pixels respectively disposed in the pixel areas on the light blocking layer and each including a light emitting element.

In an embodiment, the opening may be divided into first, second, third, and fourth areas based on a first imaginary line extending in a first direction passing through a center of the opening and a second imaginary line extending in a second direction crossing the first direction passing through the center in a plan view. In such an embodiment, the first and third areas may be opposite to each other with respect to the center of the opening, and the second and fourth areas may be opposite to each other with respect to the center of the opening.

In an embodiment, the first, second, third, and fourth areas may have planar shapes symmetrical to each other.

In an embodiment, the first, second, third, and fourth areas may have planar shapes asymmetrical to each other.

In an embodiment, the substrate may include a first base layer including a polymer film, a first barrier layer disposed on the first base layer, a second base layer disposed on the first barrier layer and including a polymer film, and a second barrier layer disposed on the second base layer.

In an embodiment, each of the plurality of pixels may include a blue sub-pixel arranged in a first column, a red sub-pixel arranged in a first row and a second column adjacent to the first column, and a green sub-pixel arranged in a second row adjacent to the first row and in the second column.

In an embodiment, a size of the blue sub-pixel may be different from a size of the red sub-pixel and a size of the green sub-pixel in a plan view.

In an embodiment, each of the red sub-pixel, the green sub-pixel, and the blue sub-pixel may have a rectangular shape in a plan view.

A display device according to embodiments of the disclosure includes a substrate including a first display area including a plurality of first pixel areas and a transmission area and a second display area including a plurality of second pixel areas, a light blocking layer disposed in the first and second display areas on the substrate, where an opening overlapping the transmission area is defined through the light blocking layer, and the opening has a planar shape including at least two adjacent curves having different radii of curvature from each other, and a plurality of pixels respectively disposed in the first and second pixel areas on the light blocking layer and each including a light emitting element. In such embodiments, as the opening has a planar shape including at least two adjacent curves having different radii of curvature from each other, degradation of performance of the functional module due to external light introduced around a functional module disposed under the substrate corresponding to the first display area may be reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
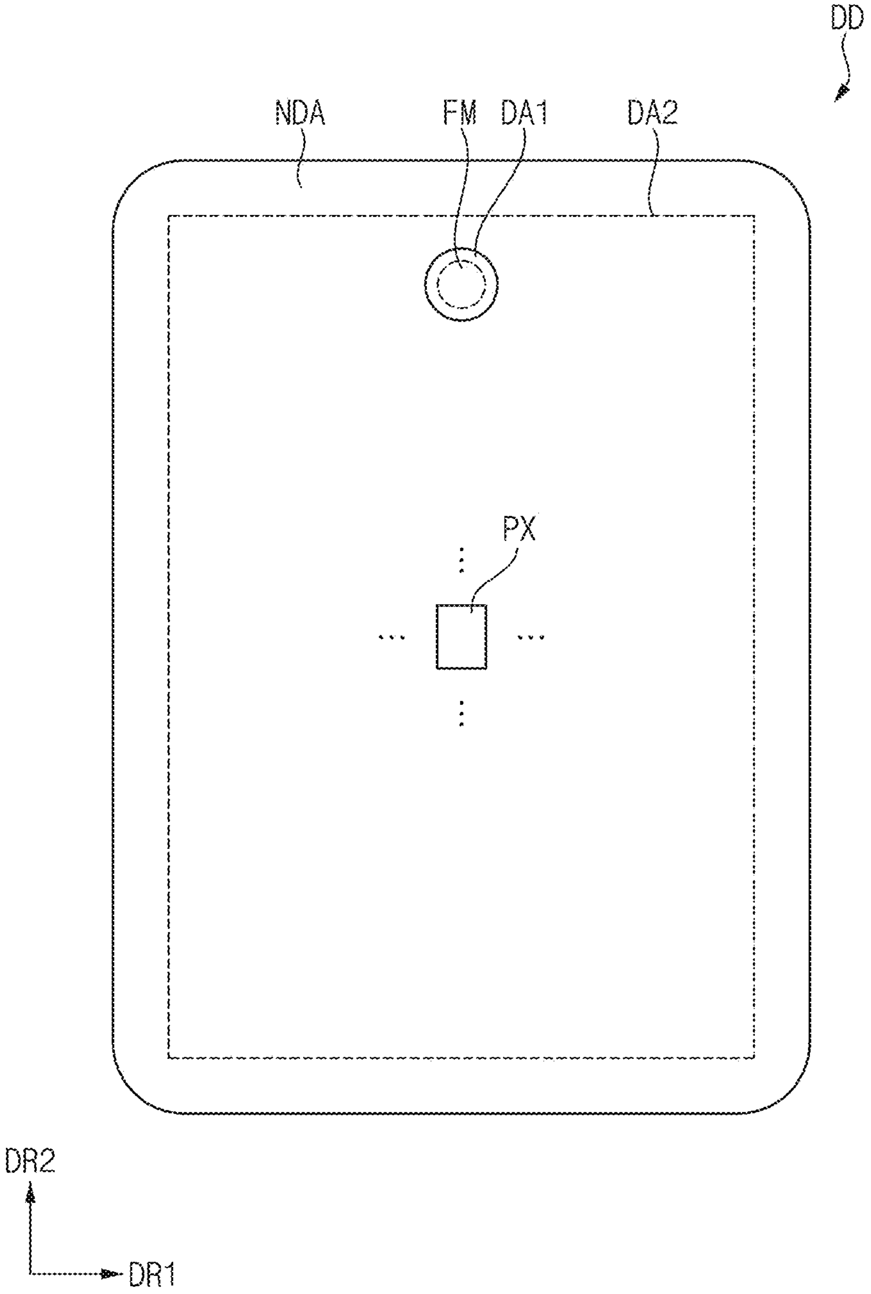
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings. The same or like reference numerals refer to the same or like components in the drawings, and any repetitive detailed descriptions of the same or like components will be omitted or simplified.

Figure 2:
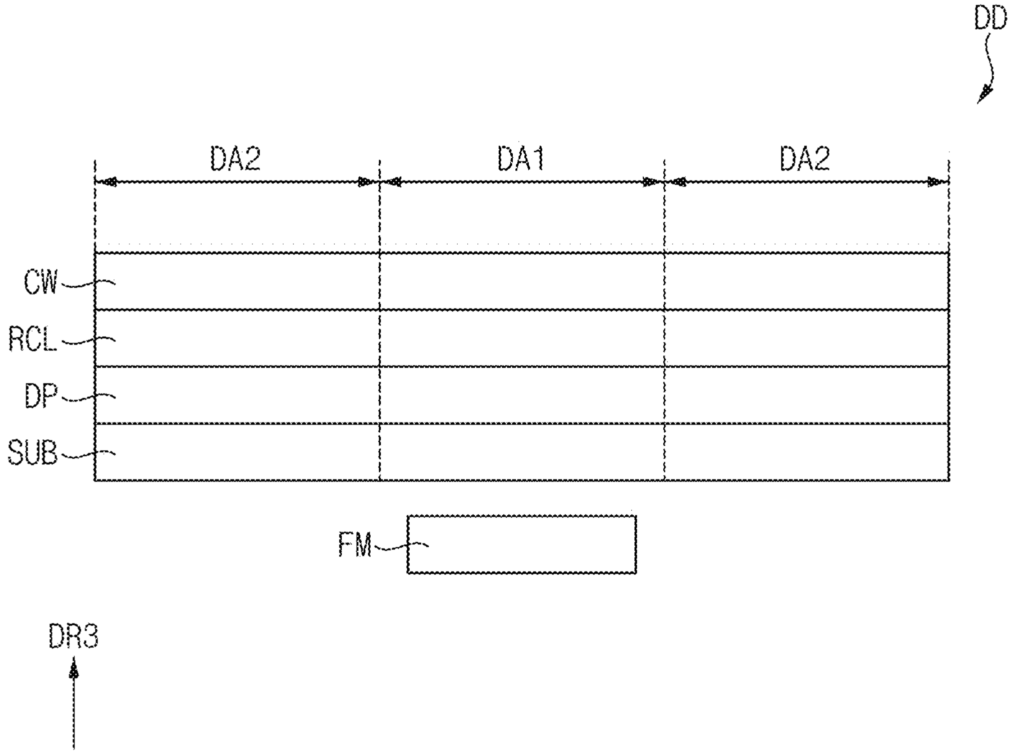
FIG. 2 is a cross-sectional view schematically illustrating a first display area and a second display area of the display device of FIG. 1.

FIG. 1 is a plan view illustrating a display device according to an embodiment. FIG. 2 is a cross-sectional view schematically illustrating a first display area and a second display area of the display device of FIG. 1.

Referring to FIGS. 1 and 2, a display device DD according to an embodiment may include a substrate SUB, a display portion DP, an anti-reflection layer RCL, and a cover window CW.

The display device DD may include a first display area DA1, a second display area DA2, and a non-display area NDA. Each of the first display area DA1 and the second display area DA2 may be defined as an area in which an image is displayed. The non-display area NDA may be defined in which no image is displayed. The non-display area NDA may be positioned around the second display area DA2. In an embodiment, for example, the non-display area NDA may surround at least a portion of the second display area DA2.

The first display area DA1 may include a transmission area through which external light is transmitted. As the first display area DA1 includes the transmission area through which external light is transmitted, the transmittance of the first display area DA1 may be higher than the transmittance of the second display area DA2. That is, the transmittance of the second display area DA2 may be lower than the transmittance of the first display area DA1. In such an embodiment, the first display area DA1 may transmit external light incident thereon while displaying an image.

The plurality of pixels PX may be disposed in each of the first display area DA1 and the second display area DA2. The plurality of pixels PX may be arranged in a matrix form along a first direction DR1 and a second direction DR2 crossing the first direction DR1. A third direction may be a direction perpendicular to the first direction DR1 and the second direction DR2 or may be a thickness direction of the display device DD or the substrate SUB. Each of the plurality of pixels PX may include a transistor and a light emitting element electrically connected to the transistor. In an embodiment, for example, each of the plurality of pixels PX may emit light of a specific color (e.g., red, green, blue, and the like).

The first display area DA1 and the second display area DA2 may be positioned adjacent to each other. In an embodiment, the second display area DA2 may surround at least a portion of the first display area DA1. In an embodiment, for example, the first display area DA1 may be spaced apart from an edge of the display device DD in a plan view and may be positioned within the display device DD, and the second display area DA2 may cover an entirety of the first display area DA1. Herein, the term “in a plan view” may mean “in a top plan view” or “when viewed in the third direction.”

The first display area DA1 may have a smaller density of pixels PX than the second display area DA2. That is, the first display area DA1 may have fewer pixels PX per unit area than the second display area DA2.

In an embodiment, as shown in FIG. 1, the first display area DA1 may have a circular planar shape. However, the configuration of the disclosure is not limited thereto, and alternatively, the first display area DA1 may have various polygonal planar shapes.

A plurality of drivers may be disposed in the non-display area NDA. In an embodiment, for example, the drivers may include a gate driver, an emission control driver, and a data driver. The driving units may provide gate signals, data signals, emission control signals, or the like to the plurality of pixels PX.

The display portion DP may be disposed on the substrate SUB. The display portion DP may overlap the first display area DA1 and the second display area DA2. The display portion DP may include the plurality of pixels PX for displaying an image. Detailed features of the display portion DP will be described later.

The functional module FM may be disposed under the substrate SUB corresponding to the first display area DA1. The functional module FM may receive external light passing through the first display area DA1. In an embodiment, the functional module FM may include a camera module for capturing (or recognizing) an image of an object positioned in front of the display device DD, a face recognition sensor module for detecting a user’s face, a pupil recognition sensor module for detecting a user’s eyes, an acceleration sensor module and a geomagnetic sensor module for determining the movement of the display device DD, a proximity sensor module and an infrared sensor module for detecting proximity of the front of the display device DD, an illuminance sensor module for measuring the degree of external brightness, or the like.

The anti-reflection layer RCL may be disposed on the display unit DP. The anti-reflection layer RCL may overlap the first and second display areas DA1 and DA2. Reflection of external light may be reduced through the anti-reflection layer RCL. In an embodiment, for example, the antireflection layer RCL may include a polarization layer and a phase retardation layer. Alternatively, the antireflection layer RCL may include a light blocking pattern and a color filter.

The cover window CW may be disposed on the anti-reflection layer RCL. The cover window CW may overlap the first display area DA1 and the second display area DA2. The cover window CW may be disposed on the display portion DP to protect the display portion DP. In an embodiment, for example, the cover window CW may include a glass substrate or a polymer substrate.

Figure 3:
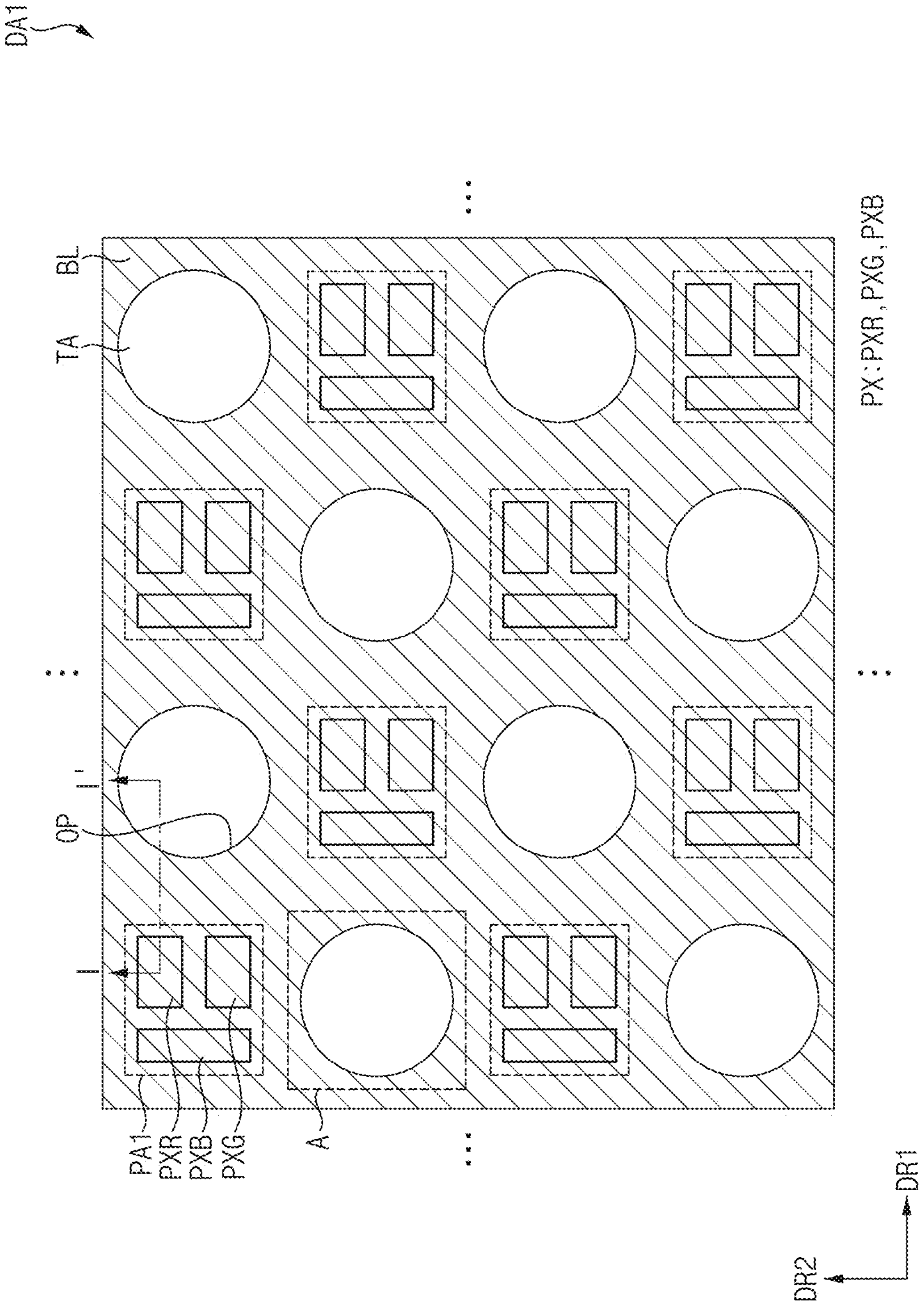
FIG. 3 is a plan view illustrating a portion of a first display area of the display device of FIG. 1.
Figure 4:
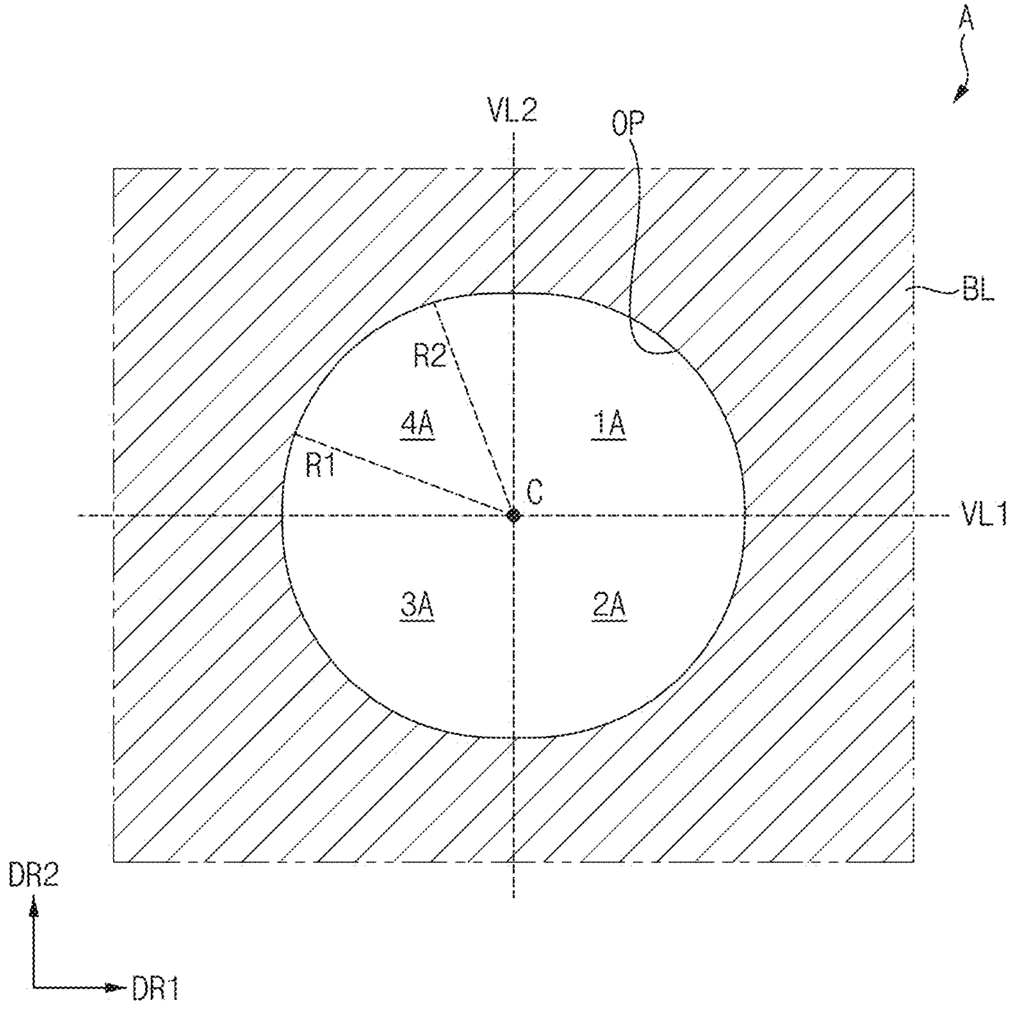
FIG. 4 is an enlarged plan view of an embodiment of area A of FIG. 3.
Figure 5:
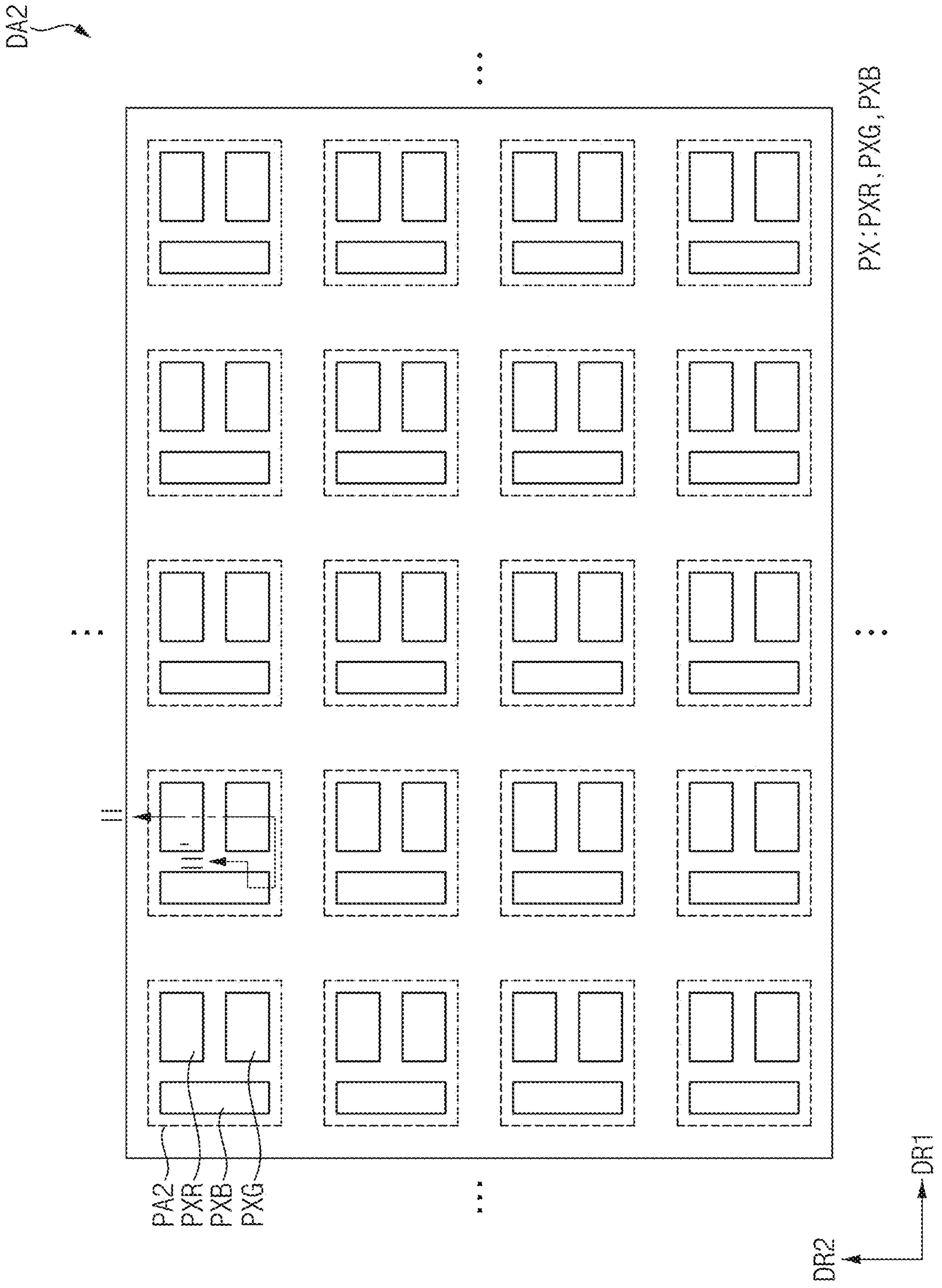
FIG. 5 is a plan view illustrating a portion of a second display area of the display device of FIG. 1.

FIG. 3 is a plan view illustrating a portion of a first display area of the display device of FIG. 1. FIG. 4 is an enlarged plan view of an embodiment of area A of FIG. 3. FIG. 5 is a plan view illustrating a portion of a second display area of the display device of FIG. 1.

Referring to FIGS. 3, 4, and 5, in an embodiment, the first display area DA1 may include a plurality of first pixel areas PA1 and a plurality of transmission areas TA, and the second display area DA2 may include a plurality of second pixel areas PA2. Each of the transmission areas TA may be positioned between the first pixel areas PA1, e.g., between two adjacent first pixel areas PA1 in the first direction DR1 or in the second direction DR2.

The plurality of pixels PX may be disposed in each of the first pixel areas PA1. In addition, the plurality of pixels PX may be disposed in each of the second pixel areas PA2.

In an embodiment, as shown in FIGS. 3 and 5, the arrangement of sub-pixels of each of the plurality of pixels PX disposed in the first pixel area PA1 may be the same as the arrangement of sub-pixels of each of the plurality of pixels PX disposed in the second pixel area PA2. Alternatively, the arrangement of sub-pixels of each of the plurality of pixels PX disposed in the first pixel area PA1 may be different from the arrangement of sub-pixels of each of the plurality of pixels PX disposed in the second pixel area PA2.

Each of the plurality of pixels PX may include a plurality of sub-pixels that emit light of different colors from each other. In an embodiment, for example, each of the plurality of pixels PX may include a red sub-pixel PXR that emits red light, a green sub-pixel PXG that emits green light, and a blue sub-pixel PXB that emits blue light.

A single red sub-pixel PXR, a single green sub-pixel PXG, and a single blue sub-pixel PXB may be disposed in each of the first pixel areas PA1. In addition, a single red sub-pixel PXR, a single green sub-pixel PXG, and a single blue sub-pixel PXB may be disposed in each of the second pixel areas PA2.

In an embodiment, for example, in the first pixel area PA1, the blue sub-pixel PXB may be disposed in a first column, the red sub-pixel PXR may be disposed in a first row and a second column adjacent to the first column, and the green sub-pixel PXG may be disposed in a second row adjacent to the first row and the second column. Similarly, in the second pixel area PA2, the blue sub-pixel PXB may be disposed in a first column, the red sub-pixel PXR may be disposed in a first row and a second column adjacent to the first column, and the green sub-pixel PXG may be disposed in a second row adjacent to the first row and the second column. However, the configuration of the disclosure is not limited thereto, and alternatively, the red sub-pixel PXR, the green sub-pixel PXG, and the blue sub-pixel PXB in the first pixel area PA1 and the second pixel area PA2 may be arranged in a variety of ways.

The size of the blue sub-pixel PXB may be different from the size of the red sub-pixel PXR and the size of the green sub-pixel PXG in a plan view. In an embodiment, the size of the blue sub-pixel PXB may be greater than the size of the red sub-pixel PXR and the size of the green sub-pixel PXG in a plan view. However, the configuration of the disclosure is not limited thereto, and alternatively, each of the blue sub-pixel PXB, the red sub-pixel PXR, and the green sub-pixel PXG may have various sizes in a plan view.

In an embodiment, the red sub-pixel PXR, the green sub-pixel PXG, and the blue sub-pixel PXB may have a same planar shape as each other. In an alternative embodiment, the red sub-pixel PXR, the green sub-pixel PXG, and the blue sub-pixel PXB may have different planar shapes from each other.

Each of the red sub-pixel PXR, the green sub-pixel PXG, and the blue sub-pixel PXB may have a polygonal planar shape. In an embodiment, each of the red sub-pixel PXR, the green sub-pixel PXG, and the blue sub-pixel PXB may have a rectangular planar shape. However, the configuration of the disclosure is not limited thereto, and alternatively, each of the red sub-pixel PXR, the green sub-pixel PXG, and the blue sub-pixel PXB may have a rhombus planar shape, for example.

The transmission area TA may be an area through which external light incident on the display device DA is transmitted. In such an embodiment, where the first display area DA1 includes the transmission area TA through which external light transmits, the functional module FM disposed under the substrate SUB corresponding to the first display area DA1 may effectively detect or recognize an object or user positioned in front of the display device DD through the transmission area TA.

The light blocking layer BL may be disposed in the first display area DA1. The light blocking layer BL may also be disposed in the second display area DA2 (see FIG. 7). In an embodiment, an opening OP overlapping the transmission area TA may be defined in the light blocking layer BL. The light blocking layer BL may effectively prevent light incident from the outside from entering the first pixel area PA1. In addition, the light blocking layer BL may effectively prevent external light transmitting the transmission area TA from being diffracted around the transmission area TA.

In embodiments, the opening OP of the light blocking layer BL may have various planar shapes. In such embodiments, the transmittance of the transmission area TA, a modulation transmission function ("MTF") of the functional module FM, and the diffraction influence of external light around the opening OP of the light blocking layer BL may vary (or be determined) according to the planar shape of the opening OP of the light blocking layer BL. Therefore, in such embodiments, the transmittance of the transmission area TA, the MTF of the functional module FM, and the diffraction influence of external light around the opening OP of the light blocking layer BL may be considered to secure the performance of the functional module FM.

In an embodiment, the opening OP of the light blocking layer BL may have a planar shape including at least two adjacent curves (or curved lines) having different radii of curvature from each other. In an embodiment, for example, the opening OP of the light blocking layer BL may include a first curve having a first radius of curvature R1 and a second curve having a second radius of curvature R2 different from the first radius of curvature R1. Accordingly, an influence of external light diffraction that may occur around the opening OP of the light blocking layer BL may be reduced. In an alternative embodiment, the opening OP of the light blocking layer BL may have a planar shape including a plurality of curved lines having different radii of curvature from each other.

In an embodiment, as shown in FIG. 4, the opening OP of the light blocking layer BL may be divided into first, second, and third, and fourth areas 1A, 2A, 3A, and 4A. In such an embodiment, the opening OP of the light blocking layer BL may be divided into first, second, third, and fourth areas 1A, 2A, 3A, and 4A based on a first imaginary line extending VL1 in the first direction DR1 passing through a center (or a center point) C of the opening OP and a second imaginary line VL2 extending in the second direction DR2 crossing the first direction DR1 and passing through the center C in a plan view. The first area 1A may be opposite to the third area 3A with respect to the center C of the opening or in a diagonal direction (i.e., a direction crossing the first direction DR1 and the second direction DR2 in a plan view), and the second area 2A may be opposite to the fourth area 4A with respect to the center C of the opening or in a diagonal direction. In an embodiment, the first area 1A and the third area 3A may be symmetrical to each other based on (or with reference to) the center C of the opening OP, and the second area 2A and the fourth area 4A may be symmetrical to each other based on the center C of the opening OP. In addition, the first area 1A may be symmetrical to the second area 2A based on the first imaginary line VL1 and symmetrical to the fourth area 4A based on the second imaginary line VL2. That is, the first, second, third, and fourth areas 1A, 2A, 3A, and 4A may have planar shapes symmetrical to each other. In an alternative embodiment, the first, second, third, and fourth areas 1A, 2A, 3A, and 4A may have planar shapes asymmetrical to each other.

As described above, in the display device DD according to an embodiment, the opening OP of the light blocking layer BL may have a planar shape including at least two adjacent curves having different radii of curvature. Accordingly, an influence of external light diffraction that may occur around the opening OP of the light blocking layer BL may be reduced. In such an embodiment, degradation of performance of the functional module FM due to external light introduced around the functional module FM disposed under the substrate SUB corresponding to the first display area DA1 may be improved.

Figure 6:
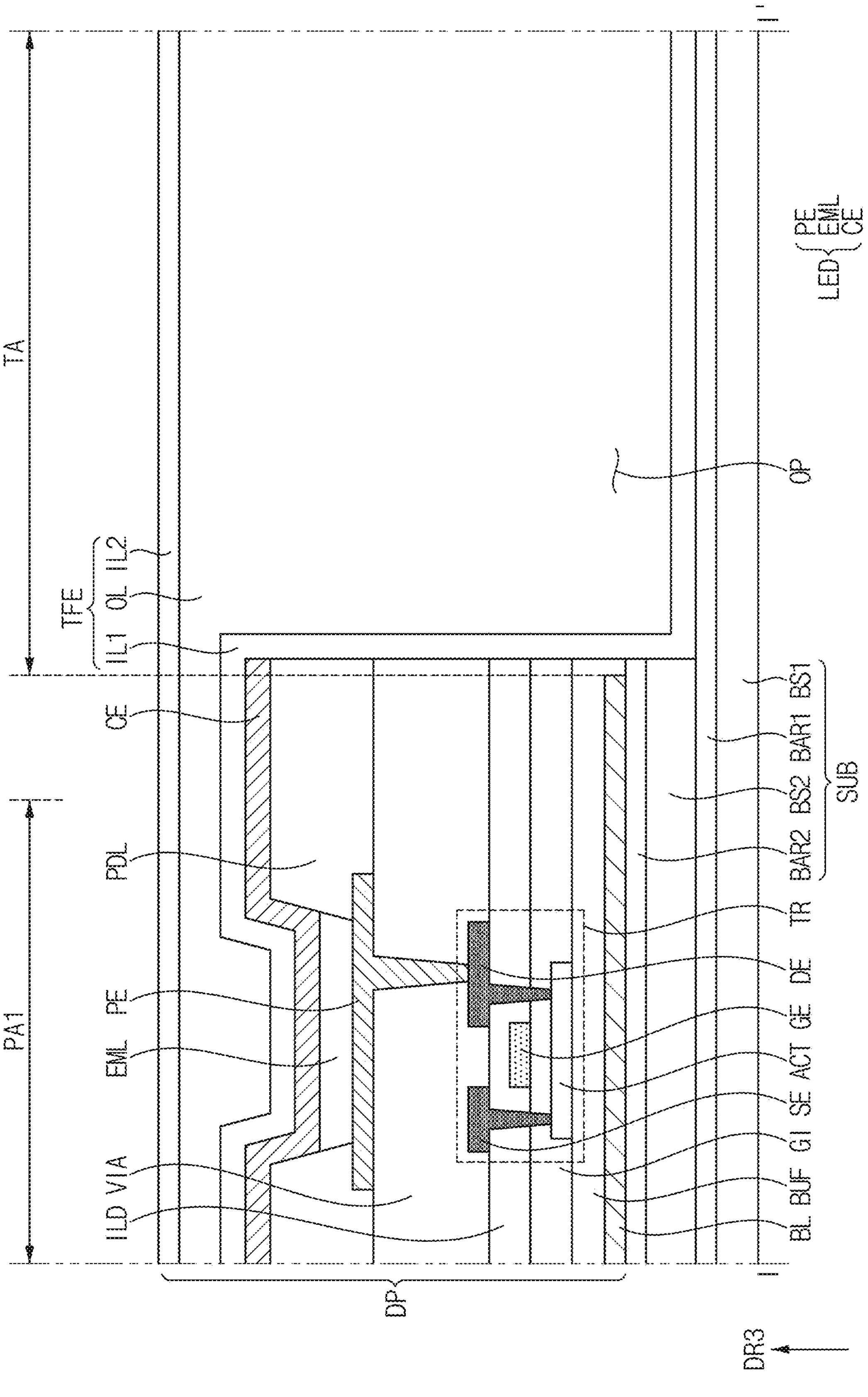
FIG. 6 is a cross-sectional view taken along line I-I' of FIG. 3.
Figure 7:
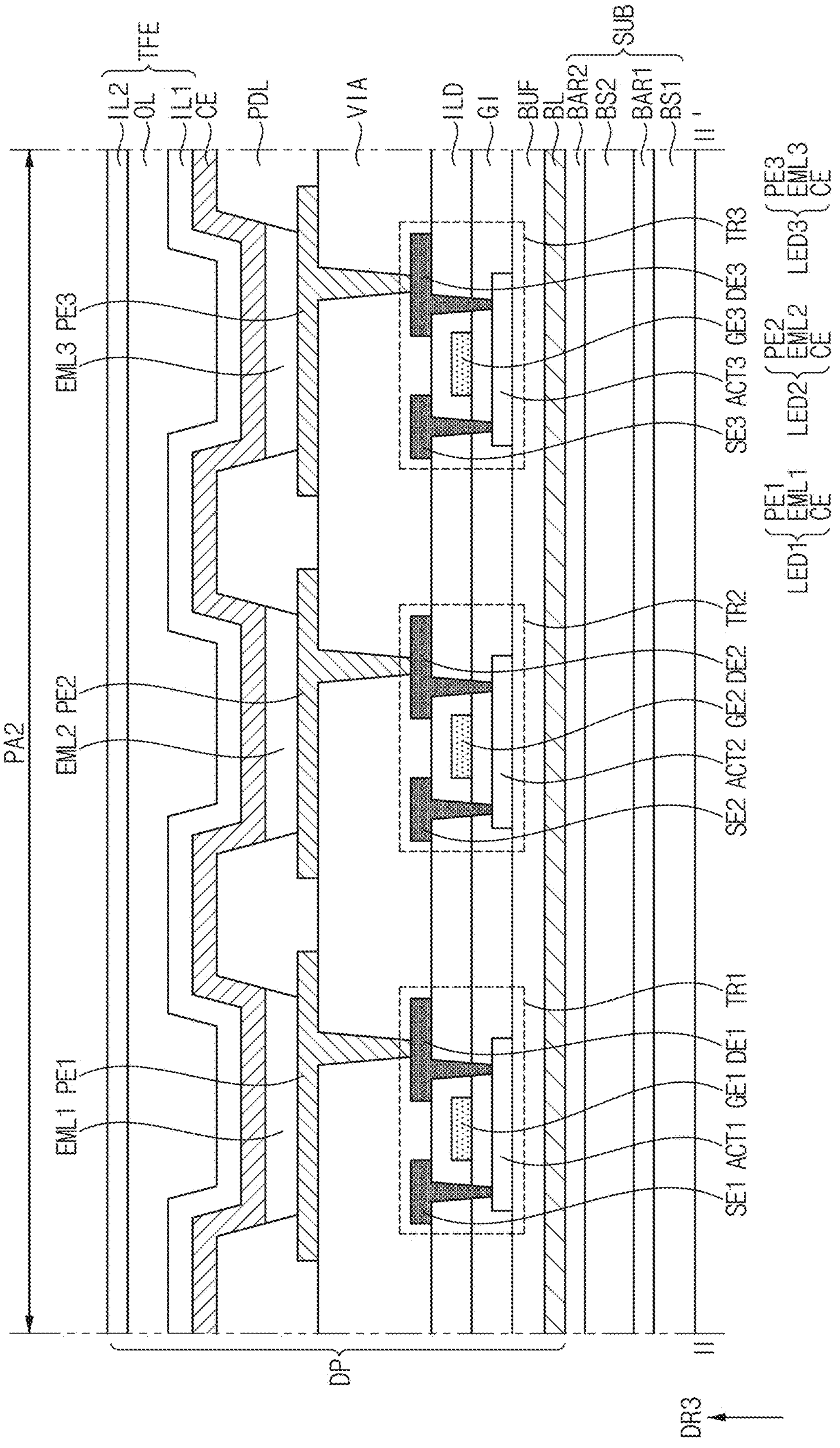
FIG. 7 is a cross-sectional view taken along line II-IP of FIG. 5.

FIG. 6 is a cross-sectional view taken along line I-I' of FIG. 3. FIG. 7 is a cross-sectional view taken along line of FIG. 5.

Referring to FIGS. 2, 6, and 7, the display device DD according to an embodiment may include the substrate SUB, the display portion DP, the anti-reflection layer RCL, and the cover window CW. The display portion DP may include a buffer layer BUF, a light blocking layer BL, a transistor TR, first, second and third transistors TR1, TR2 and TR3, a gate insulating layer GI, an interlayer insulating layer ILD, a via insulating layer VIA, a pixel defining layer PDL, a light emitting element LED, first, second and third light emitting elements LED1, LED2 and LED3, and an encapsulation layer TFE.

In such an embodiment, the transistor TR may include an active pattern ACT, a gate electrode GE, a source electrode SE, and a drain electrode DE. In addition, the first transistor TR1 may include a first active pattern ACT1, a first gate electrode GE1, a first source electrode SE1 and a first drain electrode DE1. The second transistor TR2 may include a second active pattern ACT2, a second gate electrode GE2, a second source electrode SE2, and a second drain electrode DE2. The third transistor TR3 may have a third active pattern ACT3, a third gate electrode GE3, a third source electrode SE3, and a third drain electrode DE3.

The light emitting element LED may include a pixel electrode PE, a light emitting layer EML, and a common electrode CE. In addition, the first light emitting element LED1 may include a first pixel electrode PE1, a first light emitting layer EML1 and the common electrode CE. The second light emitting element LED2 may include a second pixel electrode PE2, a second light emitting layer EML2, and the common electrode CE. The third light emitting element LED3 may include a third pixel electrode PE3, a third light emitting layer EML3, and the common electrode CE.

As described above, in an embodiment, the display device DD may include the first display area DA1 and the second display area DA2. In such an embodiment, as the display device DD includes the first display area DA1 and the second display area DA2, the substrate SUB may also include portions corresponding to the first display area DA1 and the second display area DA2.

The substrate SUB may include a transparent material or an opaque material. The substrate SUB may include or be made of a transparent resin substrate. Examples of the transparent resin substrate may include polyimide substrates or the like. Alternatively, the substrate SUB may include a quartz substrate, a synthetic quartz substrate, a calcium fluoride substrate, an F-doped quartz substrate, a soda-lime glass substrate, an alkali-free substrate, non-alkali glass substrate, or the like. These may be used alone or in combination with each other.

The substrate SUB may have a multilayer structure. In an embodiment, the substrate SUB may include a first base layer BS1, a first barrier layer BAR1, a second base layer BS2, and a second barrier layer BAR2 sequentially disposed (or stacked) one on another.

Each of the first base layer BS1 and the second base layer BS2 may include a polymer film. In an embodiment, for example, each of the first base layer BS1 and the second base layer BS2 may be a polymer film including a polymer material such as polyethylene terephthalate, polyethylene naphthalate, polyether ketone, poly carbonate, polyarylate, polyethersulfone, polyimide, or the like. These may be used alone or in combination with each other.

In an embodiment, an opening exposing a portion of an upper surface of the first barrier layer BAR1 and partially overlapping the transmission area TA may be defined in the second base layer BS2.

The first barrier layer BAR1 may prevent penetration of moisture or the like. The second barrier layer BAR2 may prevent penetration of undesired components such as impurities or moisture into layers thereabove. Each of the first barrier layer BAR1 and the second barrier layer BAR2 may include an inorganic material. In an embodiment, for example, each of the first barrier layer BAR1 and the second barrier layer BAR2 may include an inorganic material such as silicon oxide, silicon nitride, silicon oxynitride, amorphous silicon, or the like. These may be used alone or in combination with each other.

In an embodiment, an opening exposing a portion of an upper surface of the first barrier layer BAR1 and partially overlapping the transmission area TA may be defined in the second barrier layer BAR2.

The light blocking layer BL may be disposed on the substrate SUB. The light blocking layer BL may overlap the first display area DA1 and the second display area DA2. In an embodiment, the light blocking layer BL may overlap the first pixel area PA1 of the first display area DA1. The light blocking layer BL may maintain constant voltage characteristics of the transistors TR, TR1, TR2, and TR3. The light blocking layer BL may include a metal, a metal oxide, or the like. In an embodiment, for example, the light blocking layer BL may include titanium (Ti), molybdenum (Mo), copper (Cu), or the like. These may be used alone or in combination with each other.

In an embodiment, the opening OP overlapping the transmission area TA may be defined in the light blocking layer BL. That is, the transmission area TA may be defined by the opening OP of the light blocking layer BL. The planar shape of the opening OP is substantially the same as that as described above.

The buffer layer BUF may be disposed on the substrate SUB. The buffer layer BUF may prevent diffusion of metal atoms or impurities from the substrate SUB into the transistors TR, TR1, TR2, and TR3. In addition, the buffer layer BUF may improve flatness of the surface of the substrate SUB when the surface of the substrate SUB is not uniform. In an embodiment, for example, the buffer layer BUF may include an inorganic material such as silicon oxide, silicon nitride, silicon oxynitride, or the like. These may be used alone or in combination with each other.

The active pattern ACT may be disposed in the first pixel area PA1 on the buffer layer BUF. Each of the active pattern's ACT may include a metal oxide semiconductor, an inorganic semiconductor (e.g., amorphous silicon, poly silicon, or the like), or an organic semiconductor. The active pattern ACT may include a source region, a drain region, and a channel region positioned between the source region and the drain region.

The metal oxide semiconductor may include a two-component compound ($AB_x$), a ternary compound ($AB_xC_y$), a four-component compound (ABxCyDz), or the like containing indium (In), zinc (Zn), gallium (Ga), tin (Sn), titanium (Ti), aluminum (Al), hafnium (Hf), zirconium (Zr), magnesium (Mg), or the like. In an embodiment, for example, the metal oxide semiconductor may include zinc oxide ($ZnO_x$), gallium oxide ($GaO_x$), tin oxide ($SnO_x$), indium oxide ($InO_x$), indium gallium oxide ("IGO"), indium zinc oxide ("IZO"), indium tin oxide ("ITO"), indium zinc tin oxide ("IZTO"), indium gallium zinc oxide ("IGZO"), or the like. These may be used alone or in combination with each other.

The first, second, and third active patterns ACT1, ACT2, and ACT3 may be disposed in the second pixel area PA2 on the buffer layer BUF. The first, second, and third active patterns ACT1, ACT2, and ACT3 may be formed through a same process as the active pattern ACT and may include a same material as the active pattern ACT. In addition, each of the first, second, and third active patterns ACT1, ACT2, and ACT3 may include a source region, a drain region, and a channel region positioned between the source region and the drain region.

The gate insulating layer GI may be disposed on the buffer layer BUF. The gate insulating layer GI may sufficiently cover the active patterns ACT, ACT1, ACT2, and ACT3, and may have a substantially flat upper surface without generating a step around the active patterns ACT, ACT1, ACT2, and ACT3. Alternatively, the gate insulating layer GI may cover the active patterns ACT, ACT1, ACT2, and ACT3 and may be disposed along the profile of each of the active patterns ACT, ACT1, ACT2, and ACT3 to have a uniform thickness. In an embodiment, for example, the gate insulating layer GI may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other.

In an embodiment, an opening partially exposing a portion of an upper surface of the first barrier layer BAR1 and partially overlapping the transmission area TA may be defined in the gate insulating layer GI.

The gate electrode GE may be disposed in the first pixel area PA1 on the gate insulating layer GI. The gate electrode GE may overlap the channel region of the active pattern ACT. The gate electrode GE may include a metal, an alloy metal nitride, a conductive metal oxide, a transparent conductive material, or the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like. Examples of the conductive metal oxide may include indium tin oxide or indium zinc oxide. In addition, examples of the metal nitride may include aluminum nitride ($AlN_x$), tungsten nitride ($WN_x$), chromium nitride ($CrN_x$), or the like. These may be used alone or in combination with each other.

The first, second, and third gate electrodes GE1, GE2, and GE3 may be disposed in the second pixel area PA2 on the gate insulating layer GI. The first, second, and third gate electrodes GE1, GE2, and GE3 may be formed through a same process as the gate electrode GE and may include a same material as the gate electrode GE. In addition, each of the first, second, and third gate electrodes GE1, GE2, and GE3 may overlap the channel region of a corresponding one of the first, second, and third active patterns ACT1, ACT2, and ACT3.

The interlayer insulating layer ILD may be disposed on the gate insulating layer GI. The interlayer insulating layer ILD may sufficiently cover the gate electrodes GE, GE1, GE2, and GE3 and may have a substantially flat upper surface without generating a step around the gate electrode GE, GE1, GE2, and GE3. Alternatively, the interlayer insulating layer ILD may cover the gate electrode and may be disposed along the profile of each of the gate electrodes GE, GE1, GE2, and GE3 to have a uniform thickness. In an embodiment, for example, the interlayer insulating layer ILD may include an inorganic material such as silicon oxide, silicon nitride, silicon carbide, silicon oxynitride, silicon oxycarbide, or the like. These may be used alone or in combination with each other.

In an embodiment, an opening exposing a portion of an upper surface of the first barrier layer BAR1 and partially overlapping the transmission area TA may be defined in the interlayer insulating layer ILD.

The source electrode SE and the drain electrode DE may be disposed in the first pixel area PA1 on the interlayer insulating layer ILD. The source electrode SE may be connected to the source region of the active pattern ACT through a contact hole defined through the gate insulating layer GI and the interlayer insulating layer ILD. The drain electrode DE may be connected to the drain region of the active pattern ACT through a contact hole defined through the gate insulating layer GI and the interlayer insulating layer ILD.

In an embodiment, for example, each of the source electrode SE and the drain electrode DE may include a metal, an alloy, a metal nitride, a conductive metal oxide, a transparent conductive material, or the like. These may be used alone or in combination with each other.

Accordingly, the transistor TR including the active pattern ACT, the gate electrode GE, the source electrode SE, and the drain electrode DE may be disposed in the first pixel area PA1 on the substrate SUB.

The first, second, and third source electrodes SE1, SE2, and SE3 and the first, second, and third drain electrodes DE1, DE2, and DE3 may be disposed in the second pixel area PA2 on the interlayer insulating layer ILD. The first, second, and third source electrodes SE1, SE2, and SE3 may be formed through a same process as the source electrode SE and may include a same material as the source electrode SE. In addition, the first, second, and third drain electrodes DE1, DE2, and DE3 may be formed through a same process as the drain electrode DE and may include a same material as the drain electrode DE.

Each of the first, second, and third source electrodes SE1, SE2, and SE3 may be connected to the source region of a corresponding one of the first, second, and third active patterns ACT1, ACT2, and ACT3 through a contact hole defined through the gate insulating layer GI and the interlayer insulating layer ILD. In addition, each of the first, second, and third drain electrodes DE1, DE2, and DE3 may be connected to the drain region of a corresponding one of the first, second, and third active patterns ACT1, ACT2, and ACT3 through a contact hole defined through the gate insulating layer GI and the interlayer insulating layer ILD.

The via insulating layer VIA may be disposed on the interlayer insulation layer ILD. The via insulating layer VIA may sufficiently cover the source electrodes SE, SE1, SE2, and SE3 and the drain electrodes DE, DE1, DE2, and DE3. The via insulating layer VIA may include an organic material. In an embodiment, for example, the via insulating layer VIA may be made of phenolic resin, polyacrylates resin, polyimides rein, polyamides resin, siloxane resin, epoxy resin, or the like. These may be used alone or in combination with each other.

In an embodiment, an opening exposing a portion of the upper surface of the first barrier layer BAR1 and partially overlapping the transmission area TA may be defined in the via insulating layer VIA.

The pixel electrode PE may be disposed in the first pixel area PA1 on the via insulating layer VIA. The pixel electrode PE may be connected to the drain electrode through a contact hole defined through the via insulating layer VIA. In an embodiment, for example, the pixel electrode PE may include a metal, an alloy, a metal nitride, a conductive metal oxide, a transparent conductive material, or the like. These may be used alone or in combination with each other. In an embodiment, the pixel electrode PE may have a stacked structure including ITO/Ag/ITO.

The first, second, and third pixel electrodes PE1, PE2, and PE3 may be disposed in the second pixel area PA2 on the via insulating layer VIA. The first, second, and third pixel electrodes PE1, PE2, and PE3 may be formed through a same process as the pixel electrode PE and may include a same material as the pixel electrode PE. Each of the first, second, and third pixel electrodes PE1, PE2, and PE3 may be connected to a corresponding one of the first, second, and third drain electrodes DE1, DE2, and DE3 through a contact hole defined through the via insulating layer VIA.

The pixel defining layer PDL may be disposed on the via insulating layer VIA. The pixel defining layer PDL may cover opposing side portions of the pixel electrodes PE, PE1, PE2, and PE3. In addition, an opening exposing a portion of the upper surface of the pixel electrodes PE, PE1, PE2, and PE3 may be defined in the pixel defining layer PDL. In an embodiment, for example, the pixel defining layer PDL may include an inorganic material or an organic material. In an embodiment, the pixel defining layer PDL may include an organic material such as an epoxy resin, a siloxane resin, or the like. These may be used alone or in combination with each other. In an alternative embodiment, the pixel defining layer PDL may further include a light blocking material containing a black pigment or black dye.

In an embodiment, an opening exposing a portion of the upper surface of the first barrier layer BAR1 and partially overlapping the transmission area TA may be defined in the pixel defining layer PDL.

The light emitting layer EML may be disposed on the pixel electrode PE. The light emitting layer EML may include an organic material that emits light of a preset color. In an embodiment, for example, the light emitting layer EML may include an organic material emitting red light.

Each of the first, second, and third light emitting layers EML1, EML2, and EML3 may be disposed on a corresponding one of the first, second, and third pixel electrodes PE1, PE2, and PE3. In an embodiment, for example, the first light emitting layer EML1 may include an organic material that emits red light, the second light emitting layer EML2 may include an organic material that emits green light, and the third light emitting layer EML3 may include an organic material that emits blue light.

The common electrode CE may be disposed on the light emitting layers EML, EML1, EML2, and EML3 and the pixel defining layer PDL. In an embodiment, for example, the common electrode CE may include a metal, an alloy, a metal nitride, a conductive metal oxide, a transparent conductive material, or the like. These may be used alone or in combination with each other.

The encapsulation layer TFE may be disposed on the common electrode CE. The encapsulation layer TFE may prevent impurities, moisture, or the like from penetrating into the light emitting elements LED, LED1, LED2, and LED3 from the outside. The encapsulation layer TFE may include at least one inorganic layer and at least one organic layer. In an embodiment, the encapsulation layer TFE may include a first inorganic encapsulation layer ILL an organic encapsulation layer OL, and a second inorganic encapsulation layer.

The first inorganic encapsulation layer IL1 may be disposed on the common electrode CE. The first inorganic encapsulation layer IL1 may overlap the first and second display areas DA1 and DA2. In an embodiment, the first inorganic encapsulation layer IL1 may be disposed along the profile of the openings of the second base layer BS2, the second barrier layer BAR2, the gate insulating layer GI, the interlayer insulating layer ILD, the via insulating layer VIA, and the pixel defining layer PDL in the transmission area TA.

The organic encapsulation layer OL may be disposed on the first inorganic encapsulation layer IL1. The organic encapsulation layer OL may overlap the first and second display areas DA1 and DA2. In an embodiment, the portion of the organic encapsulation layer OL overlapping the transmission area TA may fill the openings of the second base layer BS2, the second barrier layer BAR2, the gate insulating layer GI, the interlayer insulating layer ILD, the via insulating layer VIA, and the pixel defining layer PDL. In an embodiment, for example, the organic encapsulation layer OL may include organic materials such as polyethylene terephthalate, polyethylene naphthalate, polycarbonate, polyimide, polyethylene sulfonate, polyoxymethylene, polyarylate, hexamethyldisiloxane, acrylic resin, or the like. These may be used alone or in combination with each other.

The second inorganic encapsulation layer IL2 may be disposed on the organic encapsulation layer OL. The second inorganic encapsulation layer IL2 may overlap the first and second display areas DA1 and DA2. In an embodiment, for example, the second inorganic encapsulation layer IL2 may include an inorganic material such as silicon oxide, silicon nitride, silicon oxynitride, or the like. These may be used alone or in combination with each other.

FIGS. 8, 9, 10, and 11 are enlarged plan views of alternative embodiments of area A of FIG. 3.

Hereinafter, any repetitive detailed descriptions of the same or like elements as those of the display device DD described with reference to FIGS. 3 and 4 will be omitted or simplified.

Referring to FIGS. 3, 8, 9, 10, and 11, the first display area DA1 may include the plurality of first pixel areas PA1 and the plurality of transmission areas TA.

The light blocking layer BL may be disposed in the first display area DA1. In an embodiment, as described above, the opening OP overlapping the transmission area TA may be defined in the light blocking layer BL. The opening OP of the light blocking layer BL may have various planar shapes.

Figure 8:
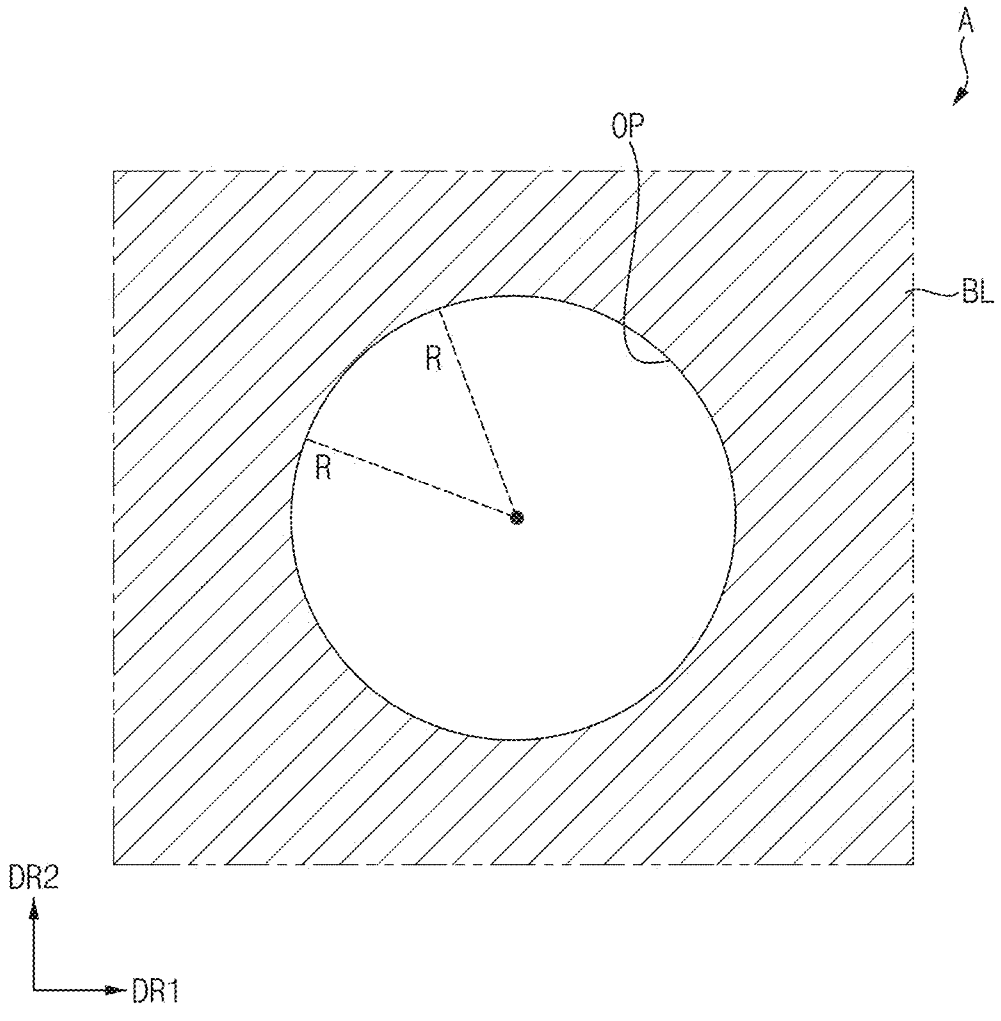
FIGS. 8, 9, 10, and 11 are enlarged plan views of alternative embodiments of area A of FIG. 3.

In an embodiment, as illustrated in FIG. 8, the opening OP of the light blocking layer BL may have a circular planar shape. That is, the opening OP of the light blocking layer BL may have a planar shape including a plurality of curves having a same radius of curvature R as each other (or a constant radius of curvature). In an embodiment, for example, the opening OP of the light blocking layer BL may include a first curve having a first radius of curvature R and a second curve having a second radius of curvature R equal to the first radius of curvature R. Alternatively, the opening OP of the light blocking layer BL may have an elliptical planar shape.

Figure 9:
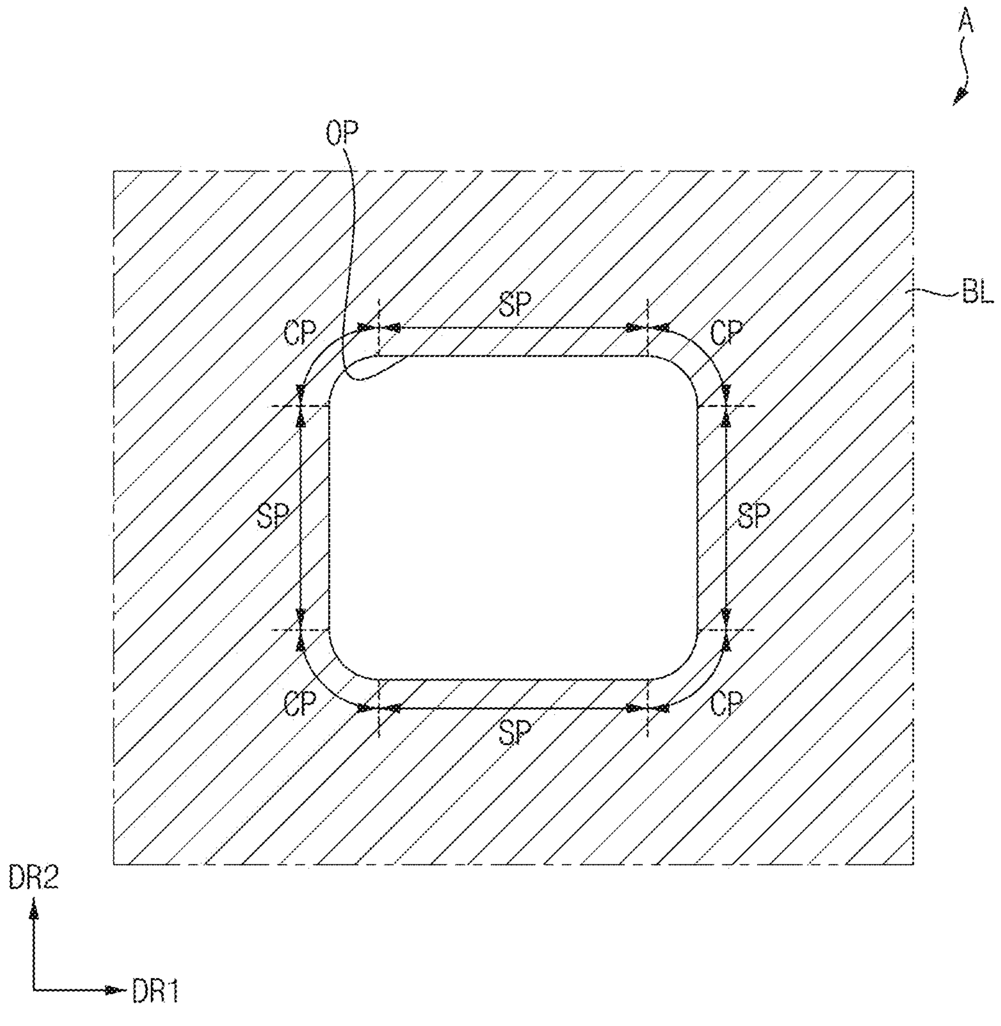

In an alternative embodiment, as illustrated in FIG. 9, the opening OP of the light blocking layer BL may have a planar shape including a plurality of straight portions SP and a plurality of curved portions CP. In an embodiment, for example, the straight portions SP may include two straight portions SP each extending in the first direction DR1 and two straight portions CP each extending in the second direction DR2, and the curved portions CP may include four curved portions CP connecting adjacent straight portions SP.

Figure 10:
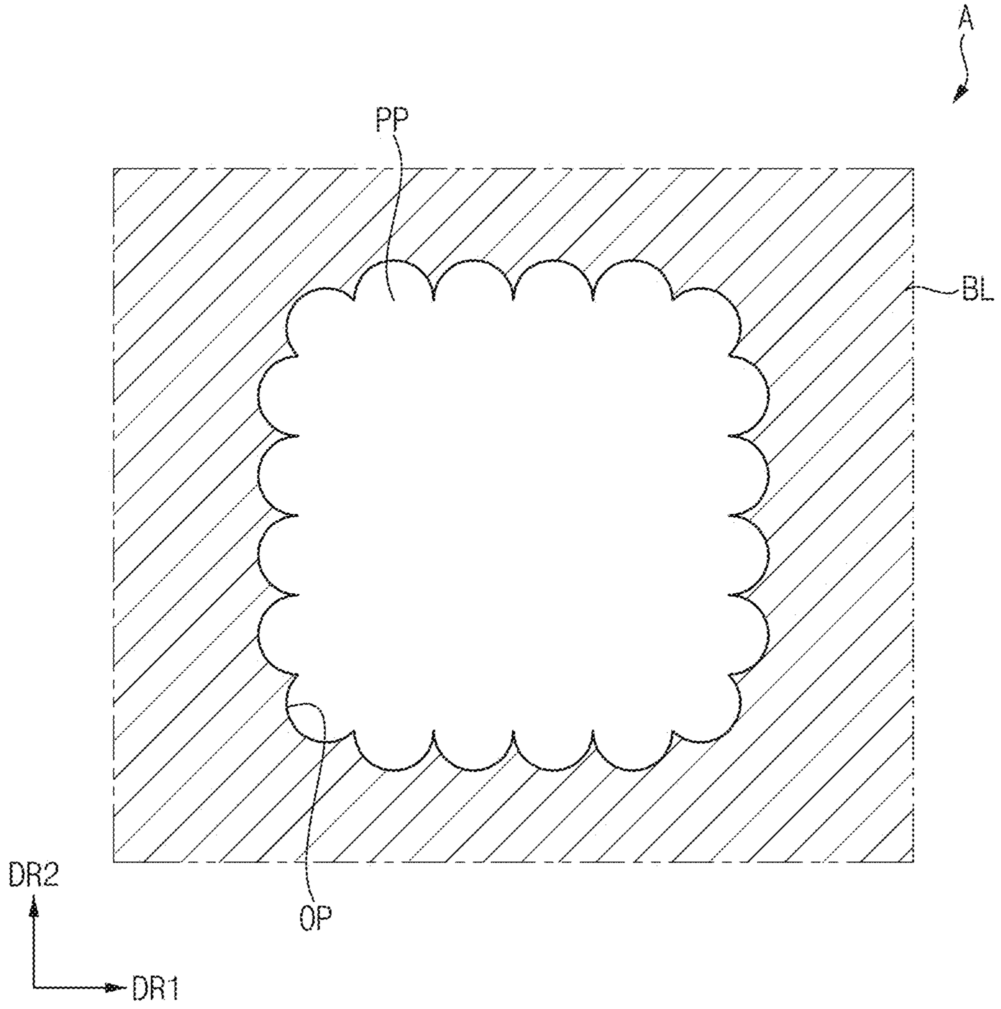

In another alternative embodiment, as illustrated in FIG. 10, an edge of the opening OP of the light blocking layer BL may have an embossed-shaped (or embossing-like) planar shape in which concave portion and convex portion are repeated. Specifically, the opening OP of the light blocking layer BL may have a planar shape in which a plurality of protrusions PP area formed at edges.

Figure 11:
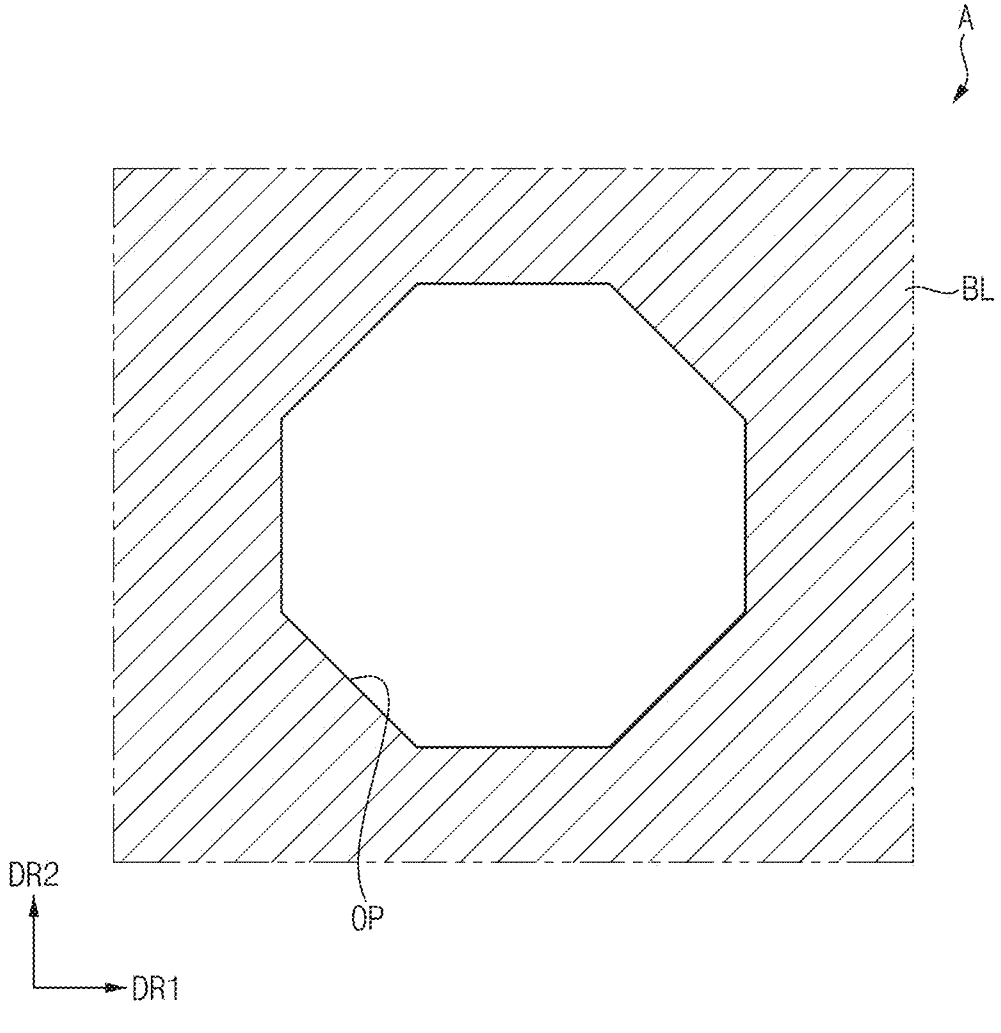

In another alternative embodiment, as illustrated in FIG. 11, the opening OP of the light blocking layer BL may have an octagonal planar shape. In an embodiment, for example, the opening OP of the light blocking layer BL may have a regular octagonal planar shape. However, the configuration of the disclosure is not limited thereto, and the opening OP of the light blocking layer BL may have various polygonal (e.g., rectangular) planar shapes.

Figure 12:
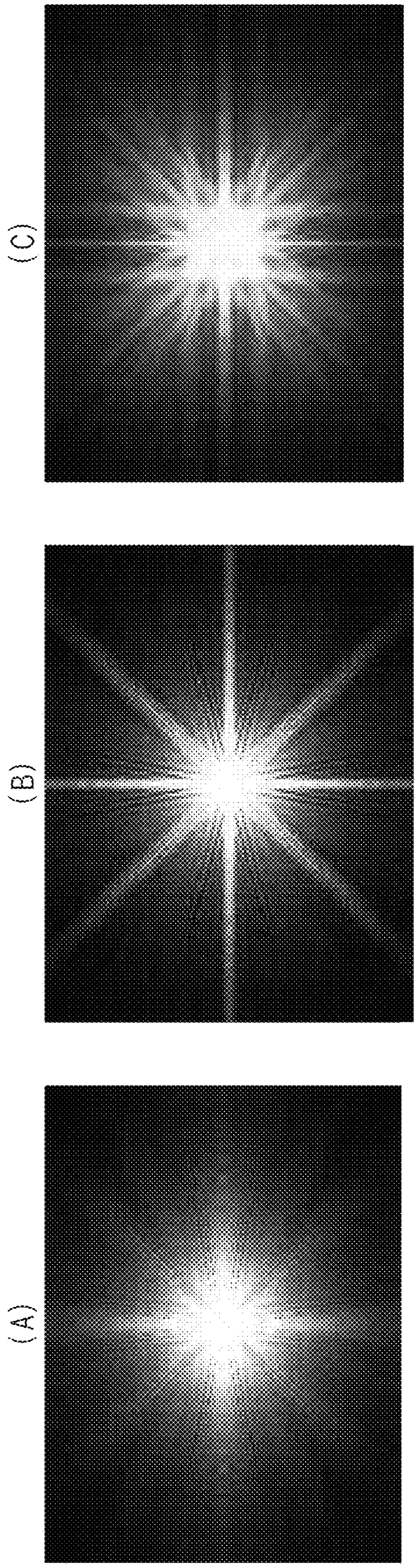
FIG. 12 is a diagram illustrating the diffraction influence of external light around an opening of a light blocking layer according to a planar shape of the opening of the light blocking layer of FIG. 3.

FIG. 12 is a diagram illustrating the diffraction influence of external light around an opening of a light blocking layer according to a planar shape of the opening of the light blocking layer of FIG. 3.

Referring to FIG. 12, diffraction of external light occurred around the opening OP of the layer BL in a case where the opening OP of the light blocking layer BL has a planar shape including at least two adjacent curves having different radii of curvature from each other (see FIG. 4) is illustrated in (A) of FIG. 12. In addition, diffraction of external light occurred around the opening OP of the layer BL in a case where the opening OP of the light blocking layer BL has a planar shape including straight portions SP and curved portions CP (see FIG. 9) is illustrated in (B) of FIG. 12. In addition, diffraction of external light occurred around the opening OP of the layer BL in a case where the edge of the opening OP of the light blocking layer BL has an embossed-shaped planar shape in which concave portion and convex portion are repeated (see FIG. 10) is illustrated in (C) of FIG. 12.

As shown in FIG. 12, when the opening OP of the light blocking layer BL has a planar shape including at least two adjacent curved lines having different radii of curvature, diffraction of external light occurred around the opening OP of the light blocking layer BL may be relatively less or substantially reduced. In this case, the performance of a functional module (e.g., the functional module FM of FIG. 2) may not deteriorate.

Embodiments of the disclosure can be applied to various display devices such as display devices for vehicles, ships and aircraft, portable communication devices, display devices for exhibition or information transmission, medical display devices, or the like, for example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a substrate including a first display area including a plurality of first pixel areas and a plurality of transmission areas, and a second display area including a plurality of second pixel areas;

a light blocking layer disposed in the first and second display areas on the substrate, wherein an opening overlapping each of the transmission areas is defined through the light blocking layer, and the opening has a planar shape including at least two adjacent circular arcs directly and tangentially connected to each other and having different radii of curvature from each other; and a plurality of pixels respectively disposed in the first and second pixel areas on the light blocking layer and each including a light emitting element.

2. The display device of claim 1, wherein the opening is divided into first, second, third, and fourth areas based on a first imaginary line extending in a first direction passing through a center of the opening and a second imaginary line extending in a second direction crossing the first direction passing through the center in a plan view, and wherein the first and third areas are opposite to each other with respect to the center of the opening, and the second and fourth areas are opposite to each other with respect to the center of the opening.

3. The display device of claim 2, wherein the first, second, third, and fourth areas have planar shapes symmetrical to each other.

4. The display device of claim 2, wherein the first, second, third, and fourth areas have planar shapes asymmetrical to each other.

5. The display device of claim 1, wherein the substrate includes:

a first base layer including a polymer film;

a first barrier layer disposed on the first base layer;

a second base layer disposed on the first barrier layer and including a polymer film; and a second barrier layer disposed on the second base layer.

6. The display device of claim 1, wherein an arrangement of sub-pixels of each of the plurality of pixels disposed in the first pixel areas is the same as an arrangement of sub-pixels of each of the plurality of pixels disposed in the second pixel areas.

7. The display device of claim 6, wherein each of the plurality of pixels includes:

a blue sub-pixel arranged in a first column;

a red sub-pixel arranged in a first row and a second column adjacent to the first column; and a green sub-pixel arranged in a second row adjacent to the first row and in the second column.

8. The display device of claim 7, wherein a size of the blue sub-pixel is different from a size of the red sub-pixel and a size of the green sub-pixel in a plan view.

9. The display device of claim 7, wherein each of the red sub-pixel, the green sub-pixel, and the blue sub-pixel has a rectangular shape in a plan view.

10. The display device of claim 1, wherein a transmittance of the second display area is lower than a transmittance of the first display area.

11. The display device of claim 1, further comprising:

a functional module disposed under the substrate to overlap a portion of the substrate corresponding to the first display area.

12. The display device of claim 11, wherein the functional module includes at least one selected from a camera module, a face recognition sensor module, a pupil recognition sensor module, an acceleration sensor module, a proximity sensor module, an infrared sensor module, and an illuminance sensor module.

13. A display device comprising:

a substrate including a plurality of pixel areas and a plurality of transmission areas;

a light blocking layer disposed in the pixel areas on the substrate, wherein an opening overlapping each of the transmission areas is defined through the light blocking layer, and the opening has a planar shape including at least two adjacent circular arcs directly and tangentially connected to each other and having different radii of curvature from each other; and a plurality of pixels respectively disposed in the pixel areas on the light blocking layer and each including a light emitting element.

14. The display device of claim 13, wherein the opening is divided into first, second, third, and fourth areas based on a first imaginary line extending in a first direction passing through a center of the opening and a second imaginary line extending in a second direction crossing the first direction passing through the center in a plan view, and wherein the first and third areas are opposite to each other with respect to the center of the opening, and the second and fourth areas are opposite to each other with respect to the center of the opening.

15. The display device of claim 14, wherein the first, second, third, and fourth areas have planar shapes symmetrical to each other.

16. The display device of claim 14, wherein the first, second, third, and fourth areas have planar shapes asymmetrical to each other.

17. The display device of claim 13, wherein the substrate includes:

a first base layer including a polymer film;

a first barrier layer disposed on the first base layer;

a second base layer disposed on the first barrier layer and including a polymer film; and a second barrier layer disposed on the second base layer.

18. The display device of claim 13, wherein each of the plurality of pixels includes:

a blue sub-pixel arranged in a first column;

a red sub-pixel arranged in a first row and a second column adjacent to the first column; and a green sub-pixel arranged in a second row adjacent to the first row and in the second column.

19. The display device of claim 18, wherein a size of the blue sub-pixel is different from a size of the red sub-pixel and a size of the green sub-pixel in a plan view.

20. The display device of claim 18, wherein each of the red sub-pixel, the green sub-pixel, and the blue sub-pixel has a rectangular shape in a plan view.

* * * * *